US010763882B1

(12) United States Patent
Stone

(10) Patent No.: US 10,763,882 B1
(45) Date of Patent: Sep. 1, 2020

(54) SWITCH INTERFACE ADAPTER

(71) Applicant: VOLVO TRUCK CORPORATION, Göteborg (SE)

(72) Inventor: Jason Stone, Greensboro, NC (US)

(73) Assignee: VOLVO TRUCK CORPORATION, Gothenburg (SE)

( * ) Notice: Subject to any disclaimer, the term of this patent is extended or adjusted under 35 U.S.C. 154(b) by 0 days.

(21) Appl. No.: 16/417,829

(22) Filed: May 21, 2019

(51) Int. Cl.
| H03M 1/66 | (2006.01) |
| B60R 16/023 | (2006.01) |
| G07C 5/02 | (2006.01) |
| G07C 5/08 | (2006.01) |

(52) U.S. Cl.
CPC ............ *H03M 1/66* (2013.01); *B60R 16/023* (2013.01); *G07C 5/02* (2013.01); *G07C 5/08* (2013.01)

(58) Field of Classification Search
CPC .......... H03M 1/66; B60R 16/023; G07C 5/02; G07C 5/08
USPC .................................................. 341/130–155
See application file for complete search history.

(56) References Cited

U.S. PATENT DOCUMENTS

| 3,626,203 | A  | * | 12/1971 | Bartlett | .................. | G06F 3/0227 |
|   |   |   |   |   |   | 327/164 |
| 6,498,535 | B1 | * | 12/2002 | Allen | ...................... | H03F 1/565 |
|   |   |   |   |   |   | 330/286 |
| 7,633,095 | B1 | * | 12/2009 | Kerr | .................... | H01L 29/1045 |
|   |   |   |   |   |   | 257/133 |
| 7,859,009 | B1 | * | 12/2010 | Kerr | .................... | H01L 29/1045 |
|   |   |   |   |   |   | 257/104 |
| 7,989,889 | B1 | * | 8/2011 | Kerr | .................... | H01L 29/1045 |
|   |   |   |   |   |   | 257/335 |
| 2004/0111210 | A1 |   | 6/2004 | Davis et al. |   |   |
| 2006/0089174 | A1 | * | 4/2006 | Twerdahl | .............. | G06F 1/1626 |
|   |   |   |   |   |   | 455/567 |

(Continued)

FOREIGN PATENT DOCUMENTS

KR   20180077921 A1   7/2018

*Primary Examiner* — Lam T Mai
(74) *Attorney, Agent, or Firm* — Venable LLP; Jeffri A. Kaminski

(57) ABSTRACT

A switch interface adapter allowing a simple open/close switch to be adapted to a digital and analog diagnostic switch interface includes: at least one coil having a first terminal and a second terminal, wherein the switch is electrically connected to the first terminal or the second terminal, and the at least one coil is activated or deactivated via the switch; a first contact switch comprising a digital line, wherein the at least one coil controls opening and closing of the first contact switch to break and complete the digital line respectively, the digital line is electrically connected to the ECU, and a digital signal is generated from the digital line as a digital input for the ECU; a second contact switch comprising an analog line, wherein the at least one coil controls opening and closing of the second contact switch to break and complete the analog line respectively, the analog line is electrically connected to the ECU, an analog signal is generated from the analog line as an analog input for the ECU, and the digital line comprises a first resistor serially connected to the second contact switch; and a second resistor comprising the analog line, wherein the second resistor is parallel disposed across the first resistor and the second contact switch. The ECU compares the digital input and the analog input to diagnose the switch interface.

17 Claims, 5 Drawing Sheets

(56) References Cited

U.S. PATENT DOCUMENTS

2010/0331142 A1 12/2010 Mizoguchi et al.
2011/0172892 A1 7/2011 Matsuzaki et al.
2015/0022215 A1* 1/2015 Philippart ............. B60L 3/0069
                                                              324/503
2016/0261127 A1* 9/2016 Worry ................ G01R 31/3842

* cited by examiner

US 10,763,882 B1

SWITCH INTERFACE ADAPTER

BACKGROUND

1. Technical Field

The present disclosure relates to a switch used for a vehicle, and more specifically to a switch interface adapter.

2. Introduction

An on-board diagnostic (OBD) system may be required on a vehicle to diagnose various aspects of the vehicle, for example, detecting a misfire malfunction when one or more cylinders are continuously misfiring. However, when a power take off (PTO) implement of the vehicle is turned on, the PTO implement may interfere with a misfire diagnostic monitor of the OBD system. This may be because the PTO implement load can occur intermittently which is not in synchronization with the engine of the vehicle. In such a case, a misfire malfunction may be not distinguished from an effect caused by the PTO implement. This may result in a false positive on a misfire. As such, the misfire diagnostic monitor of the OBD system may be disabled while the PTO is on.

When the misfire diagnostic monitor of the OBD is disabled, the PTO switch may be required to perform all or a portion of the diagnostics that the misfire diagnostic monitor requires. For example, a short to high or a short to ground, or an open circuit of the PTO switch should be detected. However, some PTO switches may be a simple open/close switch. When such a PTO switch is on, it is put on a high voltage, which may be the same as a short to high voltage fault. And when such PTO switch is off, it is put on a ground voltage, which may be the same as an open circuit fault. As such, performing diagnostics on such PTO switches may not be feasible.

Further, when the misfire diagnostic monitor of the OBD system is disabled, the PTO switch may also be required to detect a rationality fault as the OBD system does. For example, the rationality fault diagnostics verify that a sensor output is neither inappropriately high nor inappropriately low (i.e., be "two-sided" diagnostics). In an example, an ambient temperature sensor of the vehicle may indicate it is freezing outside the vehicle, but it is actually summer, so the sensor intake is not rational, even though it is a valid value. However, with a simple open/close PTO switch, it may not be feasible to perform rationality, because such PTO switch is either off or on, and there is no sort of rationality between being off and on. Special resistive switches may be available to fulfill this need. However, not all applications can use these special switches.

Therefore, there is a need for a switch interface adapter that is capable of converting signals from a simple open/close switch (e.g., a PTO switch) to analog and digital sensors representation signals required for an electronic control unit (ECU) for diagnostics, for example a vehicle ECU (VECU).

SUMMARY

The present disclosure provides a switch interface adapter. The switch interface adapter may be used to electrically connect an on/off switch to an ECU. In example embodiments, the switch interface adapter includes: at least one coil or digital switching device having a first terminal and a second terminal, wherein the switch is electrically connected to the first terminal or the second terminal, and the at least one coil or digital switching device is activated or deactivated via the switch; a first contact switch comprising a digital line, wherein the at least one coil or digital switching device controls opening and closing of the first contact switch to break and complete the digital line respectively, the digital line is electrically connected to the ECU, and a digital signal is generated from the digital line as a digital input for the ECU; a second contact switch comprising an analog line, wherein the at least one coil or digital switching device controls opening and closing of the second contact switch to break and complete the analog line respectively, the analog line is electrically connected to the ECU, an analog signal is generated from the analog line as an analog input for the ECU, and the digital line comprises a first resistor serially connected to the second contact switch; and a second resistor comprising the analog line, wherein the second resistor is parallel disposed across the first resistor and the second contact switch. The ECU compares the digital input and the analog input.

The present disclosure also provides a vehicle including: an ECU; a simple on/off switch; and a switch interface adapter that electrically connects the simple on/off switch to the ECU such that the ECU is able to diagnose the switch via the switch interface. The switch interface adapter includes: at least one coil or semiconductor device having a first terminal and a second terminal, wherein the switch is electrically connected to the first terminal or the second terminal, and the at least one coil or semiconductor device is activated or deactivated via the switch; a first contact switch comprising a digital line, wherein the at least one coil or semiconductor device controls opening and closing of the first contact switch to break and complete the digital line respectively, the digital line is electrically connected to the ECU, and a digital signal is generated from the digital line as a digital input for the ECU; a second contact switch comprising an analog line, wherein the at least one coil or semiconductor device controls opening and closing of the second contact switch to break and complete the analog line respectively, the analog line is electrically connected to the ECU, an analog signal is generated from the analog line as an analog input for the ECU, and the digital line comprises a first resistor serially connected to the second contact switch; and a second resistor comprising the analog line, wherein the second resistor is parallel disposed across the first resistor and the second contact switch The disclosure further provides a switch interface adapter. The switch interface adapter comprises a high switch input and a low switch input, wherein a component is electrically connected to the high switch input or the low switch input, a digital line of the switch interface is activated or de-activated via the component to generate a digital signal, and an analog line of the switch interface is activated or de-activated via the component to generate an analog signal; a digital output electrically connected to an digital input, the digital output is generated from the digital signal of the digital line; and an analog output is electrically connected to an analog input, the analog output is generated from the analog signal of the analog line.

The disclosure further provides a switch interface adapter. The switch interface adapter includes: a digital component coupled to a high switch input and a low switch input, and is activated or de-activated via a switch to generate a digital signal, wherein the digital component comprises a first transistor having a base terminal to receive an input from high switch input; a second transistor serially connected to the first transistor and having a base terminal connected to the low switch input; and a first resistor connected to the base terminal and a collector terminal of the second transistor; and an analog component coupled to the high switch input and the low switch input, and is activated or de-activated via the switch to generate an analog signal, wherein the analog component comprises a third transistor with a base terminal connected to the collector terminal of the second transistor, a second resistor connected to a collector terminal of the first transistor and a collector terminal of the third transistor, and a third resistor parallel to the second resistor and connected to the collector terminal of the first transistor and to an emitter terminal of the third transistor.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

BRIEF DESCRIPTION OF THE DRAWINGS

The present invention will be further described below with reference to the attached drawings.

DETAILED DESCRIPTION

The present disclosure provides a switch interface adapter that is capable of converting a digital signal, for example, from a simple open/close switch, to both analog and digital signals. The open/close switch may be provided by a PTO-powered implement supplier that allows for controlling a powered implement of a vehicle, such as vacuum equipment on a truck, trash pickup equipment on a trash truck, a road marking grinder, a line painter, etc. The powered implement may be built on to the transmission, the engine, or the chassis of the vehicle. The switch can turn the implement on, and can also tell the engine to ramp up to some set speed at which the implement runs. Further an interlock feature may be built into a complete circuit including the switch, for example, the engine speed may not ramp up until a door of the vehicle is locked or the parking brake is on. Although, the following description is provided using an example of a PTO switch interface adapter, the disclosed electric switch interface adapter is equally applicable to other applications.

With the disclosed switch interface adapter, the open/close switch on an implement can be used and also have diagnostic functions. The disclosed switch interface adapter can also allow diagnostics on the ECU input circuits. The switch can be electrically connected to the disclosed PTO switch interface adapter that may then be electrically connected to diagnostic components or other components that use digital and analog inputs. For example, the switch interface adapter can provide the required inputs (both analog and digital inputs) for a VECU from only a digital input from the switch. As such, after whatever interlocks of the system are satisfied and the logic circuit is completed, the diagnostic inputs of the ECU can be put to a valid on state.

The disclosed switch interface adapter may comprise an analog component and a digital component. The analog component is preferably in a first valid range (valid on) when it is on, and also be in a second valid range (valid off) when it is off, which are different than a short to high voltage or a short to ground, respectively. In this way, a short to ground can be determined to be different from a valid off, or the switch can be determined to be disconnected or not. Also, the valid on and valid off can be compared with a digital input generated by the digital component for rationality. The digital input may be identified as either shorted or not shorted on the digital component indirectly through the rationality check to the analog.

Figure 1:
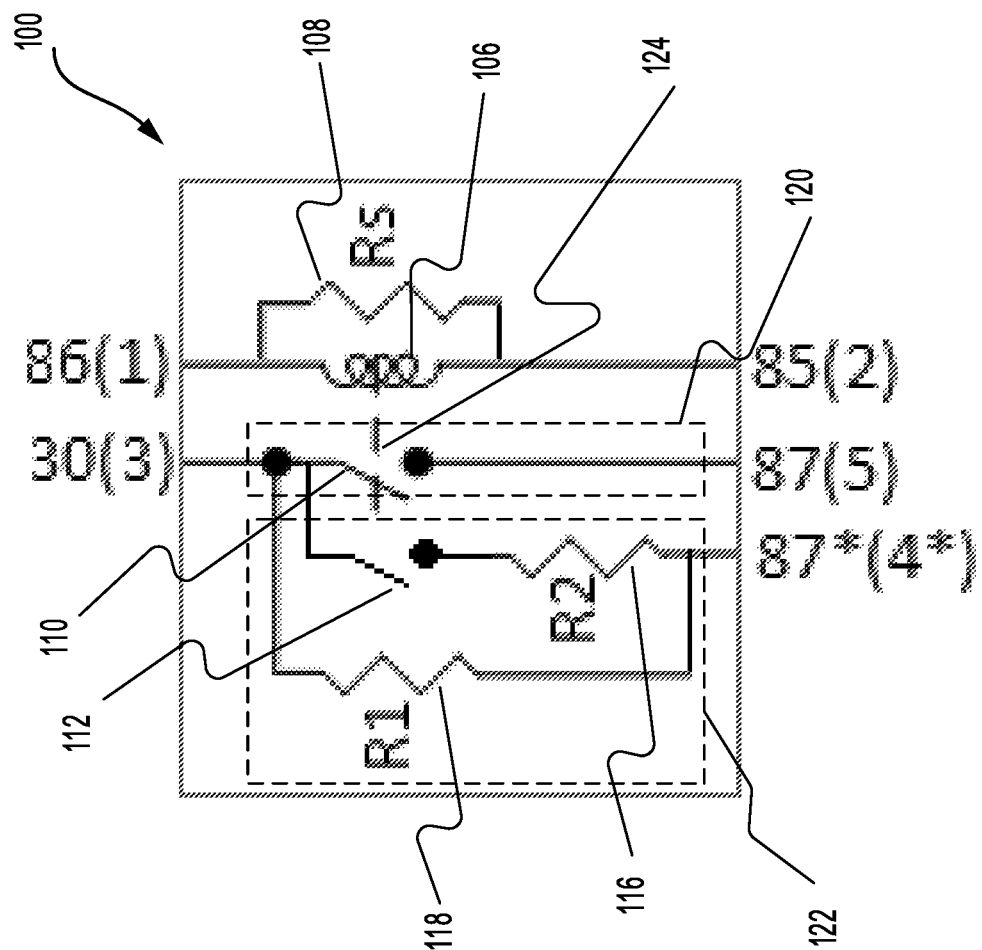
FIG. 1 illustrates is a schematic diagram of an example switch interface adapter according to one embodiment.

FIG. 1 illustrates a schematic diagram of an example switch interface adapter 100 according to one embodiment. The interface adapter 100 may function as a double pole relay with resistors configured inside the relay in order to allow for diagnostics of the relay switch state. The interface adapter 100 may comprise a coil 106, a resistor Rs 108, a first contact switch 110, a second contact switch 112, a resistor R1 116, and a resistor R2 118.

The coil 106 and the resistor Rs 108 may comprise a control circuit. The first contact switch 110, the second contact switch 112, the resistor R1 116, and the resistor R2 118 may comprise a load circuit. The load circuit may be controlled by the control circuit.

The terminal numberings of the switch interface adapter 100 may be taken from DIN 72552 which is a German automotive industry standard that has been widely adopted and allocates a numeric code to various types of electrical terminals found in vehicles. The terminals on the outside of 5-pin switch interface adapter 100 may be marked with numbers as shown below: 85 (coil negative), 86 (coil positive), 87 (normally open (NO)), and 30 (common connection to NO terminals). According to DIN 72552, the coil 106 may be fed with +12V to terminal 86 and grounded via terminal 85, however in practice it may make no difference which way around they are wired.

The terminal numberings of the switch interface adapter 100 are not limited to DIN 72552. Any suitable standard can be used. Proprietary codes can also be used.

When the coil 106 is energized with a voltage, a magnetic field is generated around it which pulls down the first contact switch 110 and the second contact switch 112 to close them. This completes the current circuits respectively between the terminals 30 and 87. When the voltage is removed from the coil terminal 86, a spring 124 pulls back the first contact switch 110 and the second contact switch 112 to break the circuits between the terminals 30 and 87.

The current circuits may comprise a digital circuit 120 and an analog circuit 122. A digital output may be obtained from the digital circuit 120, for example, an on or off status of the first contact switch 110. An analog output may be obtained from the analog circuit 122, for example, a current value corresponding to the parallel resistors R1 118 and R2 116 when the second contact switch 112 closes, and a current value corresponding to the resistor R1 118 when the second contact switch 112 opens.

When the coil 106 is de-energized rapidly, the collapsing magnetic field may produce a substantial voltage transient in its effort to disperse the stored energy and oppose the sudden change of current flow. This relatively large voltage transient may cause damages to the switch interface adapter 100. As such, the resistor Rs 108 across the coil 106 may be positioned to absorb the high voltage spikes created by the collapsed magnetic field on de-energization of the coil 106. In some embodiments, the resistor Rs 108 may be replaced with a diode across the coil 106.

The terminals of the switch interface adapter 100 can be any type and size. For example, the terminals of the switch interface adapter 100 may be 2.8 mm, 4.8 mm, 6.3 mm, or 9.5 mm wide. The resistor R1 118 may have a value of about 9.1 kΩ with an error of about 5%. The resistor R1 116 may have a value of about 3.6 kΩ with an error of about 5%. The resistor Rs 108 may have a value of about 680Ω. Both the first contact switch 110 and the second contact switch 112 may be normally open as depicted in the diagram. Terminals 30 and 87*(4*) may be gold terminals to minimize voltage drop. Terminals 30 to 87 may be allowed to pass about 10 Amps of current continuously, and standard Mini ISO switch and contact pads may be desired.

In some examples, the switch interface adapter 100 may be unsealed in a Mini 280 housing for mounting inside a cab of a vehicle. The unsealed Mini 280 housing may be defined as 25 mm×25 mm footprint and 5×2.8 mm pins. The switch interface adapter 100 may be installed in a fuse and relay center in the cab. Other types of housings with various footprints and pins may also be used.

The switch interface adapter 100 may also be mounted in a sealed skirted relay housing for mounting outside of the cab. The sealed housing may meet or exceed IP54. The sealed housing may have a mounting tab or optionally no mounting interface adapter.

In some embodiments, the above exemplary values can have different values. There can be different components of the switch interface adapter 100. Thus, this disclosure is not just limited to the above examples.

Figure 2:
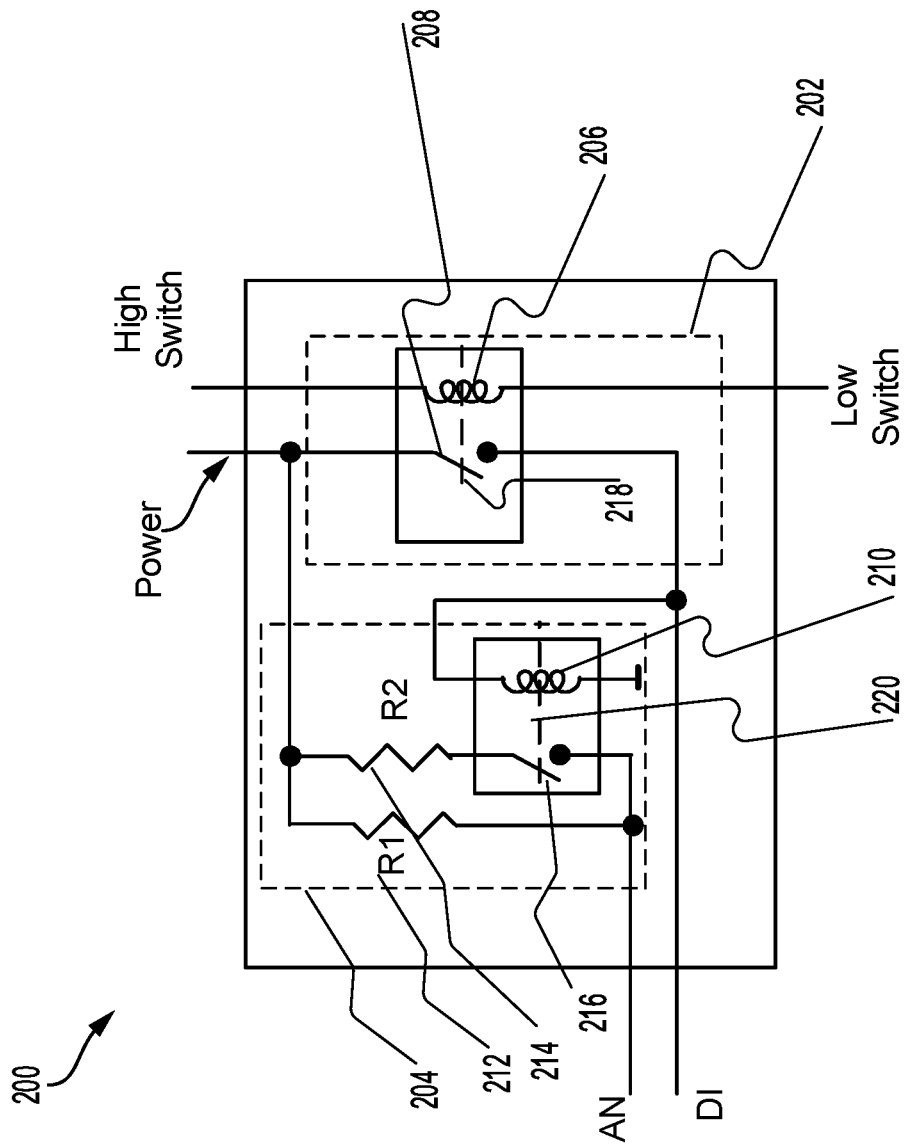
FIG. 2 illustrates a schematic diagram of an example switch interface adapter according to one embodiment.

FIG. 2 illustrates a schematic diagram of an example switch interface adapter 200 according to one embodiment. The interface adapter 200 may comprise a digital circuit or component 202 and an analog circuit or component 204.

The digital circuit 202 may comprise a first coil 206 with a coil positive terminal (high switch) and a coil negative terminal (a low switch), and a first contact switch 208.

The analog circuit 204 may comprise a second coil 210 with a coil positive terminal electrically connected to a downstream position of the first contact switch 208 line and a negative terminal electrically grounded, a resistor R1 212, a resistor R2 214 parallel to the resistor R1 212, and a second contact switch 216 electrically and serially connected to the resistor R214.

When the coil 206 is energized with a voltage, a first magnetic field is generated around it which pulls down the first contact switch 208 to close. This completes the first contact switch 208 current line (a digital line). The positive terminal of the second coil 210 may receive the power flowing through the first contact switch 208 line to activate the second coil 210. A second magnetic field is generated around the second coil 210 which pulls down the second contact switch 216 to close. This completes the second contact switch 216 current line (an analog line). When the voltage is removed from the first coil 206, a first spring 218 pulls back the first contact switch 208 to break the first contact switch 208 current line. Accordingly, the second coil 210 is de-activated, a second spring 220 pulls back the second contact switch 216 to break the second contact switch 216 current line.

A digital output (DI) may be obtained from the digital circuit 202, for example, an on or off status of the first contact switch 208. An analog output (AN) may be obtained from the analog circuit 204, for example, a current value corresponding to the parallel resistors R1 212 and R2 214 when the second contact switch 216 closes, and a current value corresponding to the resistor R1 212 when the second contact switch 216 opens.

Figure 3:
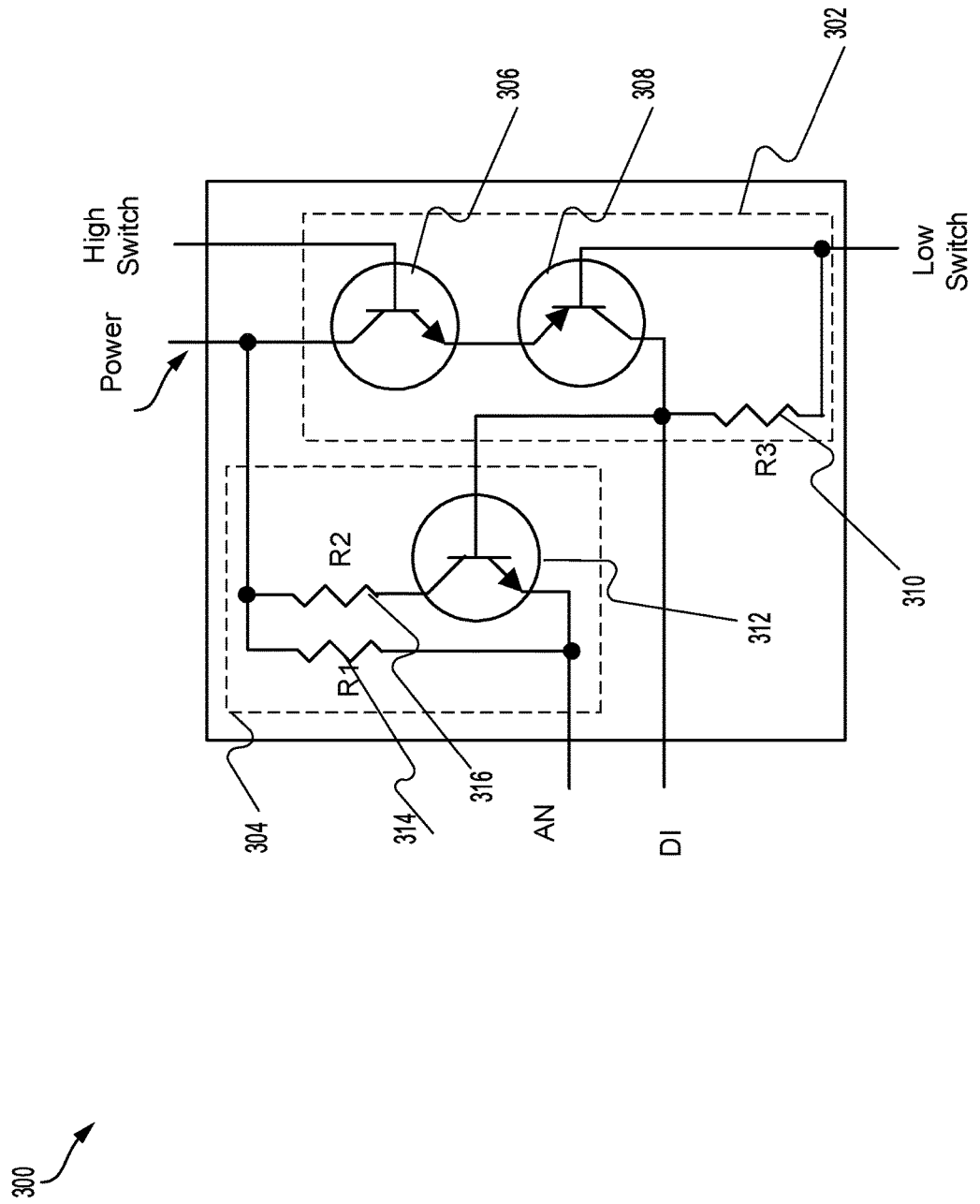
FIG. 3 illustrates a schematic diagram of an example switch interface adapter according to one embodiment.

FIG. 3 illustrates a schematic diagram of an example PTO switch interface adapter 300 according to one embodiment. The interface adapter 300 may comprise a digital component 302 and an analog component 304.

The digital component 302 may comprise a first transistor 306 with a base terminal (high switch), a second transistor 308 electrically and serially connected to the first transistor 306 and having a base terminal electrically connected to a low switch, and a resistor R3 310. One terminal of the resistor 310 is electrically connected to the base terminal of the second transistor 308, and another terminal of the resistor 310 is electrically connected to the collector terminal of the second transistor 308.

The analog circuit 304 may comprise a third transistor 312 with a base terminal electrically connected to the collector terminal of the second transistor 308, a resistor R1 314, a resistor R2 316 parallel to the resistor R1 314 and electrically and serially connected to a collector terminal of the third transistor 312.

When the first transistor 306 is activated with a voltage, the digital component 302 completes. The third transistor 312 can accordingly be activated, which completes the analog component 304. When the first transistor 306 is de-activated, the digital component 302 breaks. The third transistor 312 can accordingly be de-activated, which breaks the analog component 304.

A digital output (DI) may be obtained from the digital component 302, for example, an on or off status of the digital component 302. An analog output (AN) may be obtained from the analog component 304, for example, a current value corresponding to the parallel resistors R1 314 and R2 316 when the third transistor 312 is activated, and a current value corresponding to the resistor R1 314 when the third transistor 312 is de-activated.

Figure 4:
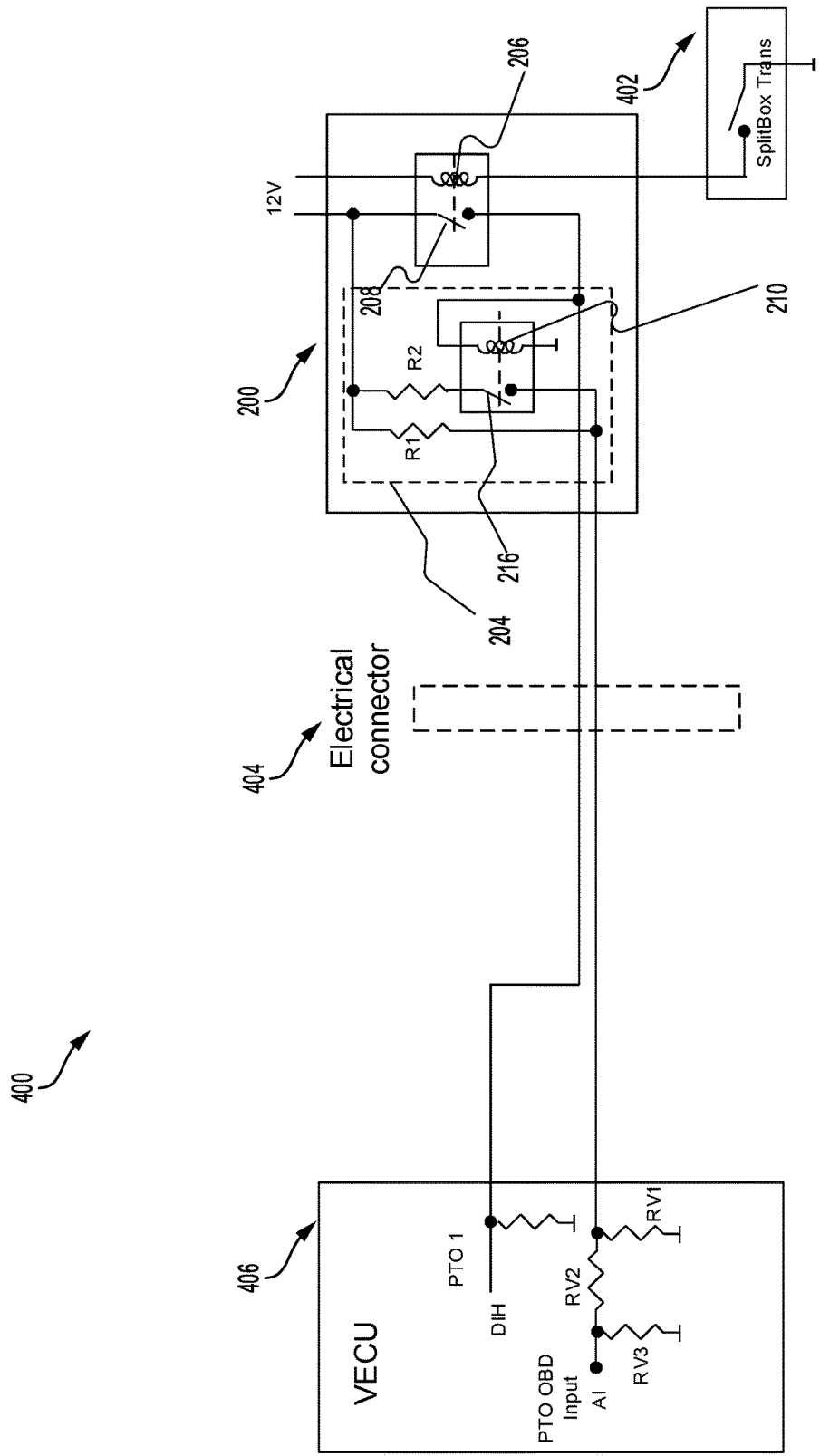
FIG. 4 illustrates a schematic diagram of an example diagnostic system comprising a PTO switch interface adapter according to one embodiment.

FIG. 4 illustrates a schematic diagram of an example diagnostic system 400 comprising the PTO switch interface adapter 200 according to one embodiment. The system 400 may comprise the PTO switch interface adapter 200, a split box transmission 402 with a PTO switch, an electronic connector 404, and a VECU 406.

The PTO switch of the split box transmission 402 may be a grounded switch that is electrically grounded to the low switch of the PTO switch interface adapter 200. The split box transmission 402 may be configured to divert power from the wheels of a vehicle. That is, the split box transmission 402 may not power the wheels when the PTO switch is on, so the transmission 402 may drive a PTO equipment.

The electrical connector 404 may be an electrical interface adapter system that may be located under the cab body of a vehicle where it cannot interfere with PTO equipment installation, and provide a quick connection for commonly used bodybuilder electrical needs. A label may be used on the electrical connector 404 to identify all electrical pinouts. The interface adapter 200 may be electrically connected to the VECU 406 via the electrical connector 404.

Without the interface adapter 200, such PTO switch may interface adapter with the vehicle via single digital pins of the PTO equipment. Such digital pins are either connected to ground or power. As such, the VECU of the vehicle may only identify two states of the PTO switch, for example, on or off. The VECU may not be able to detect the PTO switch's malfunctions (e.g., out-of-range low, out-of-range high, open circuit). For example, a short to high malfunction (shorted to a high voltage) may look like an ON state of the PTO switch, a short to low malfunction (shorted to ground) or an open circuit fault may look like an OFF state of the PTO switch. The VECU may also not be able to detect rationality malfunctions.

The interface adapter 200 can act as an electrical interface adapter between the PTO switch and the VECU, as shown in the system 400. As such, with the interface adapter 200, a simple digital output from the PTO switch can be converted into the required digital and analog inputs for the VECU. Based on the required digital and analog inputs from the interface adapter 200, the VECU can diagnose different faults of the interface adapter 200 and produce valid on and off states required. For example, the AI PTO input can now detect shorts and open as out of range faults, and DIE can be used as rationality compare to AI, which are described in detail below.

When the PTO switch closes, the coil 206 circuit in the interface adapter 200 completes. With a voltage, such as, for example a +12V or +24V, supplied to the coil 206, the coil 206 is activated. The first contact switch 208 closes to complete the digital input high (DIH) line. The DIH line may produce a digital input (DIH) to the VECU. When the PTO switch opens, the coil 206 circuit in the interface adapter 200 breaks. The coil 206 is de-activated. The first contact switch 208 opens to break the digital input high (DIH) line. The DIH line may produce a digital input (DIH) to the VECU, which may correspond to either on or off of the PTO switch. The digital input may be 1 or 0 corresponding to on or off of the PTO switch.

At the same time, the coil 210 is also activated when the DIH line completes. The second contact switch 216 closes to complete the analog line. Accordingly, the coil 210 is also de-activated when the DIH line breaks. The second contact switch 216 opens to break the analog line.

An analog input (AI) to the VECU is generated by the analogy component 204. When the second contact switch 216 closes, the AI input corresponds to a resistance value of parallel R1 and R2, which may be referred to as a valid ON state of the PTO switch. When the second contact switch 216 opens, the AI input corresponds to a resistance value of only R1, which may be referred to as a valid OFF state of the PTO switch.

In addition to the valid ON and OFF states of various components, such as the switch, the interface adapter may be diagnosed for different faults. In one example, the different faults may comprise a short to high, a short to low, and an open circuit. The short to high and short to low faults may be referred to as out-of-range high and out-of-range low, respectively (collectively referred to as out of range faults). Table 1 shows examples of out of range faults.

TABLE 1

The Analogue input shall have thresholds to determine states.

| State | Conditions |
|---|---|
| Short High | AI > Valid On Max |
| Valid On | AI < Valid On Max |
|  | AI > Valid On Min |
| Valid Off | AI < Valid On Min |
|  | AI > Valid Off Min |
| Short Low | AI < Valid Off Min |

For example, when the switch interface adapter 200 is shorted to 12-volts, the coil 206 circuit in the interface adapter 200 keeps complete. Thus, the coil 206 is kept being activated, irrespective of the actual physical status (on or off) of the PTO switch. The first contact switch 208 keeps closing to complete the digital input high (DIH) line. The DIH line keeps producing a same digital input (e.g., 1) to the VECU. At the same time, the coil 210 is also kept being activated when the DIH line completes. The second contact switch 216 keeps closing to complete the analog line. The AI input keeps corresponding to a resistance value of parallel R1 and R2. As such, the switch interface adapter 200 may indicate a fault of the short to high.

Similarly, when the switch interface adapter 200 is shorted to ground, the coil 206 circuit in the interface adapter 200 keeps breaking. Thus, the coil 206 is kept being de-activated, irrespective of the actual physical status (on or off) of the PTO switch. The first contact switch 208 keeps opening to break the digital input high (DIH) line. The DIH line keeps producing a same digital input (e.g., 0) to the VECU. At the same time, the coil 210 is also kept being de-activated when the DIH line breaks. The second contact switch 216 keeps opening to break the analog line. The AI input keeps corresponding to a resistance value of only R1. As such, the switch interface adapter 200 may indicate a fault of the short to low.

Further, the interface adapter 200 may also have rationality capability. The respective analogue and digital inputs may be compared by the VECU. If the digital input transitions to "on" within a time limit of the analogue input transitioning also to a valid on state, then the-switch interface adapter 200 shall be indicated as on state. Engine speed control and other PTO functions shall activate. If the analog input is found to be out of range of the valid on or off states, then the respective fault may be signaled as "error". Table 2 shows example rationality.

TABLE 2

Example results of comparisons between the analog input and the digital input.

|  | DIH | |
|---|---|---|
| AI | On | Off |
| On | On | error |
| Off | error | Off |
| Short/Open fault | error | error |

For example, as long as the VECU receives a resistance value of R1 from the AI input, and at the same time receives an off input from the DIE input, then the VECU may determine a valid off state. Similarly, as long as the VECU receives a resistance value of parallel R1 and R2 from the AI input, and at the same time receives an on input from the DIE input, then the VECU may determine a valid on state. Otherwise, the VECU may determine-one of faults as mentioned above.

Figure 5:
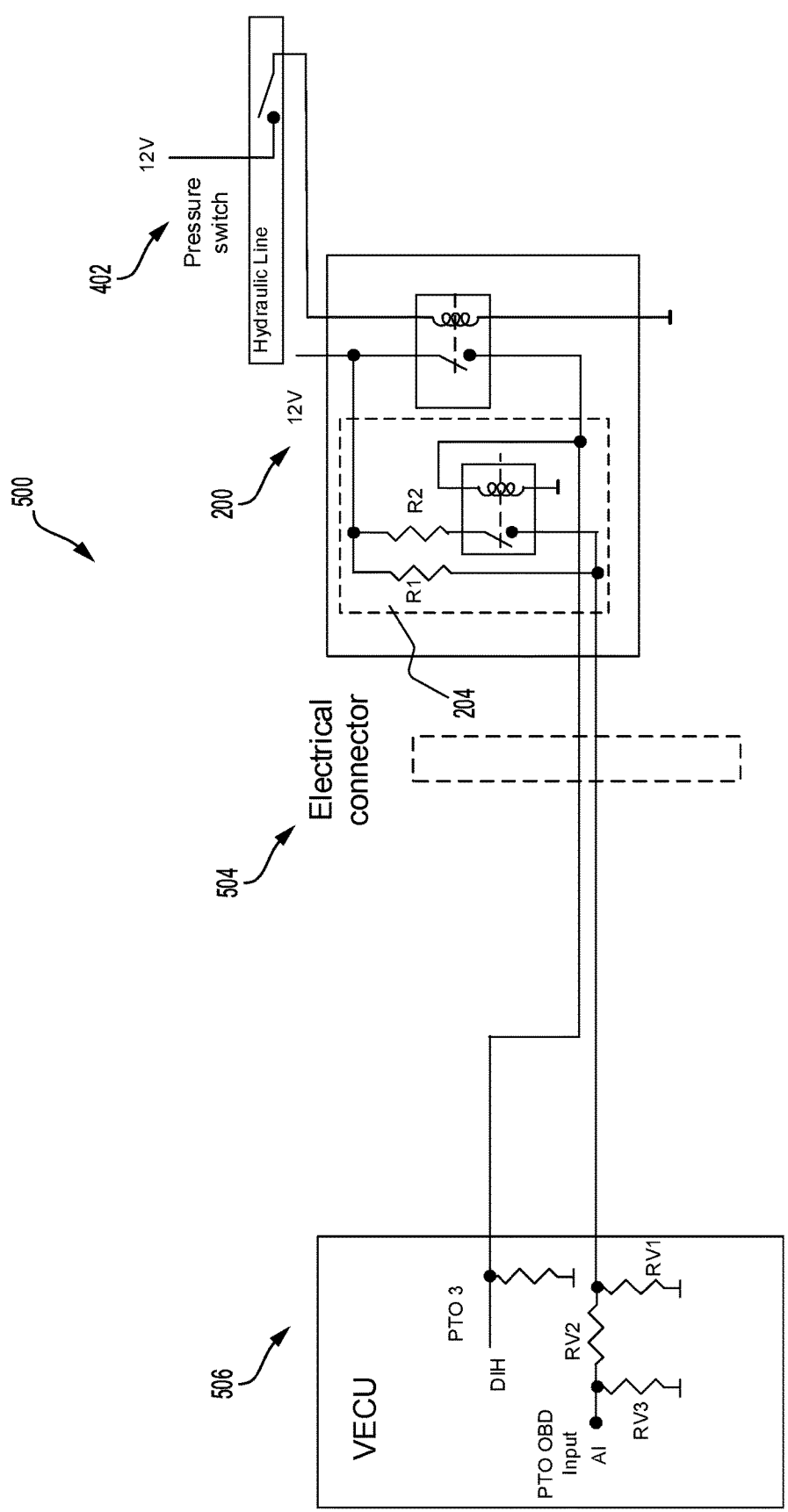
FIG. 5 illustrates a schematic diagram of an example diagnostic system comprising a PTO switch interface adapter according to one embodiment.

FIG. 5 illustrates a schematic diagram of an example diagnostic system 500 comprising the PTO switch interface adapter 200 according to one embodiment. The system 500 may comprise the PTO switch interface adapter 200, a hydraulic line 402 with a PTO switch (a pressure switch), an electronic connector 504, and a VECU 506.

In the system 500, the hydraulic line 402 with the pressure switch as a PTO-powered equipment is connected to the high switch of the PTO switch interface adapter 200. The system 500 functions substantially the same as the system 400, so detailed description will not be provided herein for the system 500, and may refer to the description of the system 400.

The disclosure further provides an electrical switch interface adapter. The electrical switch interface adapter comprises a high switch input; a low switch input. In one example, a power take-off (PTO) switch may be provided and electrically connected to the high switch input or the low switch input, a digital line of the electrical switch interface adapter is activated or de-activated via the PTO switch to generate a digital signal, and an analog line of the electrical switch interface adapter is activated or de-activated via the PTO to generate an analog signal; a digital output electrically connected to an digital pin of a vehicle engine control unit (VECU), the digital output generated from the digital signal of the digital line; and an analog output electrically connected to an analog pin of the VECU, the analog output generated from the analog signal of the analog line. The VECU may compare the digital output and the analog output diagnostics.

In some embodiments, the digital line comprises a first transistor and a second transistor electrically and serially connected to the first transistor; and the analog line comprises a first resistor, a third transistor electrically and serially connected to the first resistor, and a second resistor electrically and connected in parallel across the first resistor and the third transistor.

In some embodiments, the electrical switch interface adapter further comprises a coil having a first terminal electrically connected to the high switch input and a second terminal electrically connected to the low switch input. The digital line comprises a first contact switch, the coil controls opening and closing of the first contact switch to break and complete the digital line respectively; and the analog line comprises a second contact switch, the coil controls opening and closing of the second contact switch to break and complete the analog line respectively, the analog line comprises a first resistor serially connected to the second contact switch, and the analog line further comprises a second resistor parallel disposed across the first resistor and the second contact switch.

In some embodiments, the digital line comprises a first coil having a first terminal electrically connected to the high switch input and a second terminal electrically connected to the low switch input, the digital line comprises a first contact switch, the first coil controls opening and closing of the first contact switch to break and complete the digital line respectively; and the analog line comprises a second coil having a first terminal electrically connected to the first contact switch and a second terminal electrically connected to a grounded terminal, the analogy line comprises a second contact switch, the second coil controls opening and closing of the second contact switch to break and complete the analog line respectively, the analog line comprises a first resistor serially connected to the second contact switch, and the analog line further comprises a second resistor parallel disposed across the first resistor and the second contact switch.

The various embodiments described above are provided by way of illustration only and should not be construed to limit the scope of the disclosure. Various modifications and changes may be made to the principles described herein without following the example embodiments and applications illustrated and described herein, and without departing from the spirit and scope of the disclosure.

I claim:

1. A switch interface adapter, comprising:
   at least one coil or digital switching device having a first terminal and a second terminal, wherein the first terminal or the second terminal are configured to receive an input from a switch, and the at least one coil or digital switching device is activated or deactivated via the switch;
   a first contact switch comprising a digital line, wherein the at least one coil or digital switching device controls opening and closing of the first contact switch to break and connect the digital line respectively, the digital line is electrically connected to a digital input, and a digital signal is generated from the digital line as a digital input;
   a second contact switch comprising an analog line, wherein the at least one coil or digital switching device controls opening and closing of the second contact switch to break and connect the analog line respectively, the analog line is electrically connected to an analog input, an analog signal is generated from the analog line as an analog input, and the analog line comprises a first resistor serially connected to the second contact switch; and
   a second resistor comprising the analog line, wherein the second resistor is in parallel across the first resistor and the second contact switch.

2. The switch interface adaptor of claim 1, further comprising:
   a third resistor disposed in parallel across the at least one coil, wherein the third resistor is configured to suppress a spike voltage generated across the at least one coil upon deactivation of the at least one coil.

3. The switch interface adaptor of claim 1, further comprising an electronic control unit including the digital input and the analog input, wherein the electronic control unit is configured to:
   determine the analog input to correspond to a resistance value of only the first resistor;
   determine the digital input to correspond to the opening of the first contact switch; and
   determine the switch interface adaptor to be a valid off state.

4. The switch interface adaptor of claim 1, further comprising an electronic control unit including the digital input and the analog input, wherein the electronic control unit is configured to:
   determine the analog input to correspond to a resistance value of parallel the first resistor and the second resistor;
   determine the digital input to correspond to the closing of the first contact switch; and
   determine the switch interface adaptor to be a valid on state.

5. The switch interface adaptor of claim 1, further comprising an electronic control unit including the digital input and the analog input, wherein when the switch is at a physical on status, the electronic control unit is configured to:
  determine the analog input to correspond to a resistance value of only the first resistor;
  determine the digital input to correspond to the opening of the first contact switch; and
  determine the switch interface adaptor to be a short to low state.

6. The switch interface adaptor of claim 1, further comprising an electronic control unit including the digital input and the analog input, wherein when the switch is at a physical off status, the electronic control unit is configured to:
  determine the analog input to correspond to a resistance value of parallel the first resistor and the second resistor;
  determine the digital input to correspond to the closing of the first contact switch; and
  determine the switch interface adaptor to be a short to high state.

7. A vehicle comprising:
  an electronic control unit;
  a switch; and
  a switch interface adapter that electrically connects the switch to the electronic control unit, the switch interface adapter comprises:
  at least one coil or semiconductor device having a first terminal and a second terminal, wherein the switch is electrically connected to the first terminal or the second terminal, and the at least one coil or semiconductor device is activated or deactivated via the switch;
  a first contact switch comprising a digital line, wherein the at least one coil or semiconductor device controls opening and closing of the first contact switch to break and complete the digital line respectively, the digital line is electrically connected to the electronic control unit, and a digital signal is generated from the digital line as a digital input for the electronic control unit;
  a second contact switch comprising an analog line, wherein the at least one coil or semiconductor device controls opening and closing of the second contact switch to break and complete the analog line respectively, the analog line is electrically connected to the electronic control unit, an analog signal is generated from the analog line as an analog input for the electronic control unit, and the analog line comprises a first resistor serially connected to the second contact switch; and
  a second resistor comprising the analog line, wherein the second resistor is parallel disposed across the first resistor and the second contact switch.

8. The vehicle of claim 7, further comprising:
  a third resistor parallel disposed across the at least one coil, wherein the third resistor is configured to suppress a spike voltage generated across the at least one coil upon deactivation of the at least one coil.

9. The vehicle of claim 7, wherein the electronic control unit is configured to:
  determine the analog input to correspond to a resistance value of only the first resistor;
  determine the digital input to correspond to the opening of the first contact switch; and
  determine the switch interface adaptor to be a valid off state.

10. The vehicle of claim 7, wherein the electronic control unit is configured to:
  determine the analog input to correspond to a resistance value of parallel the first resistor and the second resistor;
  determine the digital input to correspond to the closing of the first contact switch; and
  determine the switch interface adaptor to be a valid on state.

11. The vehicle of claim 7, wherein when the switch is positioned at a physical on status, the electronic control unit is configured to:
  determine the analog input to correspond to a resistance value of only the first resistor;
  determine the digital input to correspond to the opening of the first contact switch; and
  determine the switch interface adaptor to be a short to low state.

12. The vehicle of claim 7, wherein when the switch is positioned at a physical off status, the electronic control unit is configured to:
  determine the analog input to correspond to a resistance value of parallel the first resistor and the second resistor;
  determine the digital input to correspond to the closing of the first contact switch; and
  determine the switch interface adaptor to be a short to high state.

13. An electrical switch interface adapter, comprising:
  a high switch input;
  a low switch input, wherein a switch is electrically connected to the high switch input or the low switch input;
  a digital module coupled to the high switch input and the low switch input, and is activated or de-activated via the switch to generate a digital signal;
  an analog module coupled to the high switch input and the low switch input, and is activated or de-activated via the switch to generate an analog signal;
  a digital output electrically connected to an digital pin of a vehicle engine control unit, the digital output receiving the digital signal of the digital module; and
  an analog output electrically connected to an analog pin of the vehicle engine control unit, the analog output receiving the analog signal of the analog module.

14. The electrical switch interface of claim 13, wherein:
  the digital module comprises a first transistor and a second transistor electrically and serially connected to the first transistor; and
  the analog module comprises a first resistor, a third transistor electrically and serially connected to the first resistor, and a second resistor electrically connected in parallel across the first resistor and the third transistor.

15. The electrical switch interface of claim 13, further comprising a coil having a first terminal electrically connected to the high switch input and a second terminal electrically connected to the low switch input;
  wherein:
  the digital module comprises a first contact switch, the coil controls opening and closing of the first contact switch to break and complete the digital module respectively; and
  the analog module comprises a second contact switch, the coil controls opening and closing of the second contact switch to break and complete the analog module respectively, the analog module comprises a first resistor serially connected to the second contact switch, and the analog line further comprises a second resistor parallel disposed across the first resistor and the second contact switch.

16. The electrical switch interface of claim 13, wherein:
the digital module comprises a first coil having a first terminal electrically connected to the high switch input and a second terminal electrically connected to the low switch input, the digital module comprises a first contact switch, the first coil controls opening and closing of the first contact switch to break and complete the digital module respectively; and the analog module comprises a second coil having a first terminal electrically connected to the first contact switch and a second terminal electrically connected to a grounded terminal, the analog module comprises a second contact switch, the second coil controls opening and closing of the second contact switch to break and complete the analog module respectively, the analog module comprises a first resistor serially connected to the second contact switch, and the analog line further comprises a second resistor disposed in parallel across the first resistor and the second contact switch.

17. A switch interface adapter, comprising:
a digital component coupled to a high switch input and a low switch input, and is activated or de-activated via a switch to generate a digital signal, wherein the digital component comprises a first transistor having a base terminal to receive an input from high switch input; a second transistor serially connected to the first transistor and having a base terminal connected to the low switch input; and a first resistor connected to the base terminal and a collector terminal of the second transistor; and an analog component coupled to the high switch input and the low switch input, and is activated or de-activated via the switch to generate an analog signal, wherein the analog component comprises a third transistor with a base terminal connected to the collector terminal of the second transistor, a second resistor connected to a collector terminal of the first transistor and a collector terminal of the third transistor, and a third resistor parallel to the second resistor and connected to the collector terminal of the first transistor and to an emitter terminal of the third transistor.

* * * * *